United States Patent
Zhu et al.

(10) Patent No.: US 11,552,599 B2
(45) Date of Patent: Jan. 10, 2023

(54) HARMONIC POWER AMPLIFYING CIRCUIT WITH HIGH EFFICIENCY AND HIGH BANDWIDTH AND RADIO-FREQUENCY POWER AMPLIFIER

(71) Applicants: CHINA COMMUNICATION MICROELECTRONICS TECHNOLOGY CO., LTD., Shenzhen (CN); CHINA COMMUNICATION TECHNOLOGY CO., LTD., Shenzhen (CN)

(72) Inventors: Shoukui Zhu, Shenzhen (CN); Qing Ding, Shenzhen (CN); Guangsheng Wu, Shenzhen (CN); Jianguo Ma, Shenzhen (CN)

(73) Assignees: CHINA COMMUNICATION MICROELECTRONICS TECHNOLOGY CO., LTD., Shenzhen (CN); CHINA COMMUNICATION TECHNOLOGY CO., LTD., Shenzhen (CN)

( * ) Notice: Subject to any disclaimer, the term of this patent is extended or adjusted under 35 U.S.C. 154(b) by 252 days.

(21) Appl. No.: 16/327,483

(22) PCT Filed: Aug. 22, 2016

(86) PCT No.: PCT/CN2016/096274
§ 371 (c)(1),
(2) Date: Feb. 22, 2019

(87) PCT Pub. No.: WO2018/035689
PCT Pub. Date: Mar. 1, 2018

(65) Prior Publication Data
US 2019/0181810 A1    Jun. 13, 2019

(51) Int. Cl.
*H03F 3/191* (2006.01)
*H03F 1/56* (2006.01)
(Continued)

(52) U.S. Cl.
CPC ............. *H03F 1/565* (2013.01); *G06F 30/36* (2020.01); *H03F 1/0205* (2013.01); *H03F 3/20* (2013.01);
(Continued)

(58) Field of Classification Search
CPC ....................................... H03F 3/191
(Continued)

(56) References Cited

U.S. PATENT DOCUMENTS

| 6,828,862 B2 * | 12/2004 | Barak | H03F 3/193 330/277 |
| 8,374,359 B2 * | 2/2013 | Ickler | H04R 3/02 381/118 |
| 2009/0189696 A1 * | 7/2009 | Deng | H03F 1/0205 330/302 |

FOREIGN PATENT DOCUMENTS

| CN | 103236430 | 8/2013 |
| CN | 103986421 | 8/2014 |

(Continued)

*Primary Examiner* — Henry Choe
(74) *Attorney, Agent, or Firm* — Maier & Maier, PLLC

(57) ABSTRACT

Embodiments of the present disclosure include a harmonic power amplifying circuit with high efficiency and high bandwidth and a radio-frequency power amplifier. The circuit comprises an input matching network (11), a transistor (M), and an output matching network (12); a gate of the transistor (M) connected to an output end of the input matching network (11), a drain thereof connected to an input end of the output matching network (12), and a source thereof being grounded; wherein the output matching network (12) enables a lower sideband of the harmonic power amplifying circuit to work in a continuous inverse F ampli- (Continued)

fication mode and an upper sideband of the harmonic power amplifying circuit to work in a continuous F amplification mode; wherein the output matching network (12) and a parasitic network of the transistor (M) form a low pass filter. By transitioning from the continuous inverse F power amplifier working mode to the continuous F power amplifier working mode, the efficiency of a continuous harmonic control power amplifier is effectively improved to be higher than 60%, a relative bandwidth is improved to be higher than 80%, and the harmonic impedance is simple to match and easy to realize.

9 Claims, 3 Drawing Sheets

(51) Int. Cl.
  *H03F 3/20*  (2006.01)
  *G06F 30/36*  (2020.01)
  *H03F 1/02*  (2006.01)
  *H03F 3/217*  (2006.01)

(52) U.S. Cl.
  CPC ....... *H03F 3/217* (2013.01); *H03F 2200/165* (2013.01); *H03F 2200/171* (2013.01); *H03F 2200/222* (2013.01); *H03F 2200/387* (2013.01); *H03F 2200/423* (2013.01); *H03F 2200/451* (2013.01)

(58) Field of Classification Search
  USPC .................................................. 330/302, 305
  See application file for complete search history.

(56) References Cited

FOREIGN PATENT DOCUMENTS

| | | |
|---|---|---|
| CN | 104185955 | 12/2014 |
| CN | 106208972 | 12/2016 |
| CN | 205945655 | 2/2017 |
| WO | 2012145540 | 10/2012 |

\* cited by examiner

HARMONIC POWER AMPLIFYING CIRCUIT WITH HIGH EFFICIENCY AND HIGH BANDWIDTH AND RADIO-FREQUENCY POWER AMPLIFIER

CROSS-REFERENCE TO RELATED APPLICATIONS

This application is a National Stage Entry under 35 U.S.C. § 371 of PCT Application No. PCT/CN2016/096274, filed Aug. 22, 2016, the entire contents of which is incorporated by reference herein.

TECHNICAL FIELD

Embodiments of the present disclosure relate to the field of radio-frequency communication, and more particularly, to a harmonic power amplifying circuit with high efficiency and high bandwidth and a radio-frequency power amplifier.

BACKGROUND

At present, the fifth generation mobile communication system requires communications compatibility to be more powerful and therefore requires the efficiency of a radio-frequency power amplifier to be correspondingly higher. Meanwhile, with the further development of green economy, the market also requires the efficiency of a power amplifier to be higher. Generally, a power amplifier with high efficiency and high bandwidth is designed largely based on the structure of class-E power amplifier and the structure of harmonic-control power amplifier.

However, although class-E power amplifier is simple in structure and has high efficiency, class-E power amplifier in theory has an upper limit operating frequency, which limits application of class-E power amplifier in a higher frequency range.

With respect to harmonic-control power amplifier appropriate for higher working frequency, e.g., class-F power amplifier and inverse class-F power amplifier, it needs to implement precise harmonic impedance control in the drain of a transistor and have narrow bandwidth. In order to broaden bandwidth, a continuous harmonic-control power amplifier has been developed based on the structure of harmonic-control power amplifier, which comprises a continuous F power amplifier and a continuous inverse F power amplifier. However, when providing an efficiency greater than 70% and a relative bandwidth greater than 50%, the continuous F power amplifier and the continuous inverse F power amplifier need to meet impedance conditions of second harmonic and third harmonic, at the same time and within certain bandwidth, which brings a significant challenge to the design of matching circuit. The complex matching circuit reduces efficiency to a certain extent.

SUMMARY

Embodiments of this disclosure provide a harmonic power amplifying circuit with high efficiency and high bandwidth, and aim to solve problems of existing power amplifying circuits, namely, that such existing power amplifying circuits cannot realize high efficiency and high bandwidth at the same time, and with simple harmonic impedance matching.

The present disclosure may be implemented as follows. A harmonic power amplifying circuit with high efficiency and high bandwidth comprises:

an input matching network (11), a transistor (M), and an output matching network (12);

wherein the input end of the input matching network (11) is the input end of the harmonic power amplifying circuit, the gate of the transistor (M) is connected to the output end of the input matching network (11), the drain thereof is connected to the input end of the output matching network (12), the source thereof is grounded, and the output end of the output matching network (12) is the output end of the harmonic power amplifying circuit;

the output matching network (12) enables a lower sideband of the harmonic power amplifying circuit to work in a continuous inverse F amplification mode and an upper sideband of the harmonic power amplifying circuit to work in a continuous F amplification mode;

the output matching network (12) and a parasitic network of the transistor (M) form a low pass filter.

Another objective of the embodiments of this disclosure is to provide a radio-frequency power amplifier comprising the aforementioned harmonic power amplifying circuit with high efficiency and high bandwidth.

Another objective of the embodiments of this disclosure is to provide a design method of the output matching network (12) of the aforementioned harmonic power amplifying circuit with high efficiency and high bandwidth, wherein the method comprises:

using a processor circuit executing a simulation tool to obtain an optimal fundamental frequency impedance of the harmonic power amplifying circuit in a continuous inverse F amplification mode at the operating frequency of f1, and an optimal fundamental frequency impedance of the harmonic power amplifying circuit in a continuous F amplification mode at the operating frequency of f2, respectively;

obtaining element values of a third-order low pass network by table look-up, and obtaining a real number impedance-real number impedance convertor by performing frequency and impedance conversion according to element values of a third-order low pass network, design frequency and reference impedance;

in combination with the parasitic network parameters of the transistor (M), optimizing the real number impedance-real number impedance convertor to a real number impedance-complex number impedance convertor, wherein the complex number impedance equals to the optimal fundamental frequency impedance;

establishing a topological structure according to the element values of a third-order low pass network and replacing the capacitors and inductors in the topological structure by transmission lines.

Embodiments of the present disclosure combine the continuous F power amplifier and the continuous inverse F power amplifier. By transitioning from the continuous inverse F power amplifier working mode to the continuous F power amplifier working mode, the design space of a single continuous harmonic control power amplifier may be widened, the efficiency of a continuous harmonic control power amplifier may be effectively improved to be higher than 60%, a relative bandwidth may be improved to be higher than 80%, and the harmonic impedance may be simple to match and easy to realize.

DETAILED DESCRIPTION

In order to make the objective, technical solution, and advantages of the disclosure clearer, the present disclosure is further described in combination with accompanying drawings and embodiments. It should be understood that specific embodiments described herein are merely used to explain the disclosure, not to limit the disclosure. Further, technical features in each embodiment of the disclosure may be combined with each other as long as there is no conflict.

Embodiments of the present disclosure combine a continuous F power amplifier and a continuous inverse F power amplifier. By transitioning from the continuous inverse F power amplifier working mode to the continuous F power amplifier working mode, the design space of a single continuous harmonic control power amplifier may be widened, the efficiency of a continuous harmonic control power amplifier may be effectively improved to be higher than 60%, a relative bandwidth may be improved to be higher than 80%, and the harmonic impedance may be simple to match and easy to realize.

The implementations of this disclosure are described in detail in combination with specific embodiments as follows.

Figure 1:
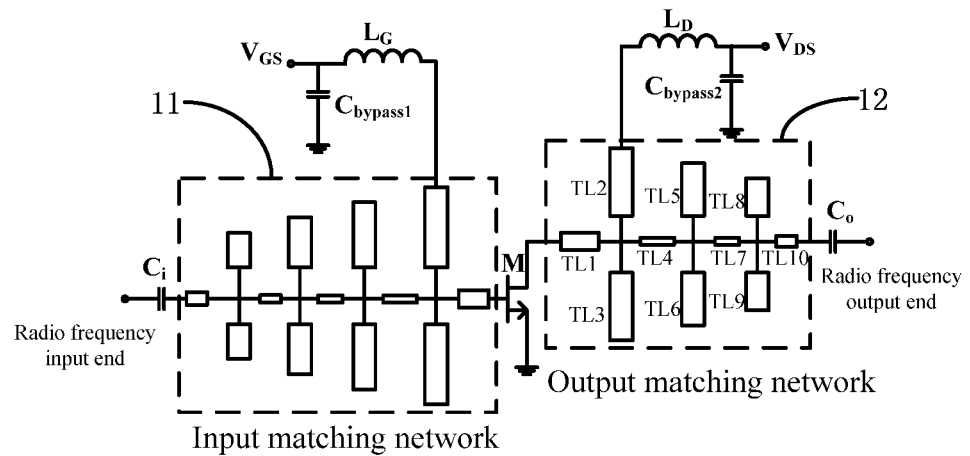
FIG. 1 illustrates a structure diagram of a harmonic power amplifying circuit with high efficiency and high bandwidth, according to an embodiment of the present disclosure.

FIG. 1 illustrates the structure of a harmonic power amplifying circuit with high efficiency and high bandwidth, according to an embodiment of the present disclosure. For illustration purposes, parts only related to this disclosure are illustrated.

As an embodiment of this disclosure, the harmonic power amplifying circuit with high efficiency and high bandwidth can be applied in any radio-frequency power amplifier. The circuit comprises:

an input matching network 11, a transistor M, and an output matching network 12;

wherein the input end of the input matching network 11 is the input end of the harmonic power amplifying circuit and is connected to one end of a capacitor $C_i$ in a bias unit, and the other end of the capacitor $C_i$ is a radio-frequency input end; the gate of the transistor M is connected to the output end of the input matching network 11, the drain thereof is connected to the input end of the output matching network 12, the source thereof is grounded, and the output end of the output matching network 12 is the output end of the harmonic power amplifying circuit and is connected to one end of a capacitor $C_o$ in the bias unit, and the other end of the capacitor $C_o$ is a radio-frequency output end; the bias end of the input matching network 11 is connected to a gate source voltage $V_{GS}$ by an inductor $L_G$ and a capacitor $C_{bypass1}$ in the bias unit; and the bias end of the output matching network 12 is connected to a drain source voltage $V_{DS}$ by an inductor $L_D$ and a capacitor $C_{bypass2}$ in the bias unit;

the output matching network 12 enables a lower sideband of the harmonic power amplifying circuit to work in a continuous inverse F amplification mode and an upper sideband of the harmonic power amplifying circuit to work in a continuous F amplification mode;

the output matching network 12 and a parasitic network of the transistor M form a low pass filter.

In an embodiment of this disclosure, according to waveform design theory, the current waveform of the continuous F power amplifier is half sine, and the voltage waveform is not unique. When only considering third harmonic, normalization voltage expression is as follows:

$$v_{CF} = \left(1 - \frac{2}{\sqrt{3}}\cos\theta + \frac{1}{3\sqrt{3}}\cos 3\theta\right) \times (1 - \gamma\sin\theta) \quad (1)$$

Because negative voltage will reduce efficiency, in order to ensure non-negative voltage, the value range of γ is −1≤γ≤1, when γ=0, the voltage waveform of a standard F power amplifier is obtained.

For the continuous inverse F power amplifier, because it and the continuous F power amplifier are dual, when only third harmonic is considered, the voltage of the continuous inverse F power amplifier is uniquely determined, with its normalization expression as follows:

$$v_{CF^{-1}} = \left(1 - \frac{2}{\sqrt{2}}\cos\theta + \frac{1}{2}\cos 2\theta\right) \quad (2)$$

However, the current waveform is not unique, with its normalization expression as follows:

$$v_{CF^{-1}} = (i_{DC} - i_1 \cos\theta + i_3 \cos 3\theta) \times (1 - \xi \sin\theta) \quad (3)$$

Wherein $i_{DC}$=0.37, 4=0.43, $i_3$=0.06. In order to ensure non-negative current, the value range of ξ is −1≤ξ≤1, when ξ=0, the voltage waveform of a standard inverse F power amplifier is obtained.

According to the formula:

$$Z_n = -\frac{V_n}{I_n} \quad (4)$$

wherein n represents harmonic component's order. According to the voltage waveform expression and the current waveform expression of the continuous F power amplifier, the impedance condition of the continuous F power amplifier can be obtained:

$$Z_F = \frac{2}{\sqrt{3}}R_{opt} + j\gamma R_{opt} \quad (5)$$

$$Z_{2,F} = -j\frac{7\sqrt{3}\pi}{24}\gamma R_{opt}$$

$$Z_{3,F} = \infty$$

wherein $R_{opt}$ is the optimal impedance of a standard B power amplifier with short-circuited high-order harmonics.

Similarly, the impedance condition of the continuous inverse F power amplifier can also be derived. For expression convenience, an admittance expression is used:

$$G_{F^{-1}} = \sqrt{2} i_1 G_{opt} + j\sqrt{2} i_{DC} \xi G_{opt}$$

$$G_{2,F^{-1}} = -j2\xi(i_1 + i_3) G_{opt}$$

$$G_{3,F^{-1}} = \infty \quad (6)$$

wherein $G_{opt} = 1/R_{opt}$.

Figure 2:
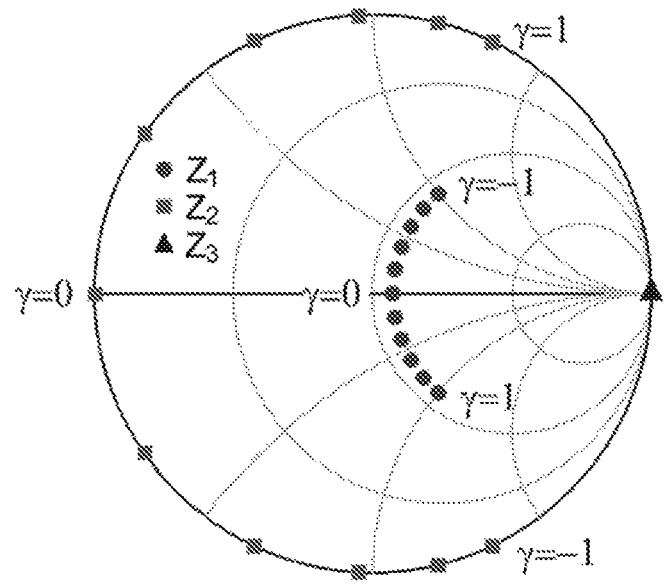
FIG. 2 illustrates a Smith chart of a continuous F power amplifier.
Figure 3:
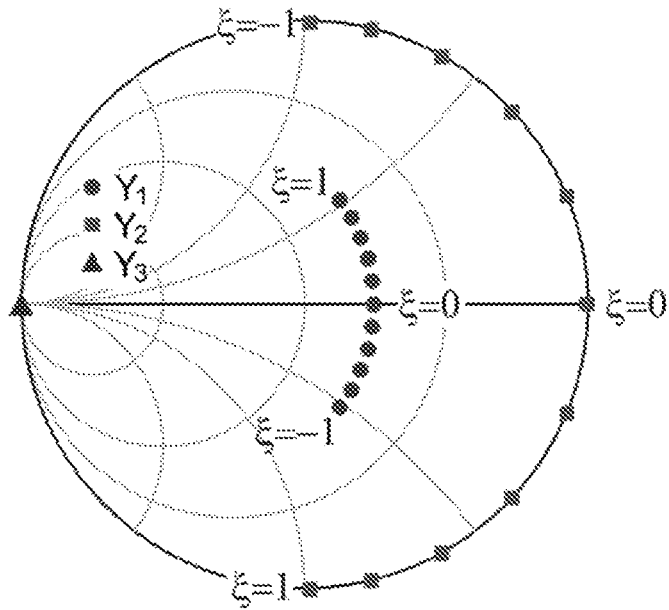
FIG. 3 illustrates a Smith chart of a continuous inverse F power amplifier.

The expression (5) expresses the design space of the continuous F power amplifier, and the normalized impedance of Smith chart is set as $R_{opt}$. As such, the design space of the continuous F power amplifier in Smith chart is illustrated in FIG. 2. The expression (6) expresses the design space of the continuous inverse F power amplifier, and similarly the normalized impedance of Smith chart is set as $R_{opt}$. As such, the design space of the continuous inverse F power amplifier in Smith chart is illustrated in FIG. 3.

Because fundamental frequency impedance is near to the circle dot, and both the second harmonic impedance and third harmonic impedance are located on round edge, a low pass filter is needed as output matching.

An output matching network 12 is designed to enable a lower sideband of the harmonic power amplifying circuit to work in a continuous inverse F amplification mode and an upper sideband of the harmonic power amplifying circuit to work in a continuous F amplification mode. By means of the transition from the continuous inverse F power amplifier working mode to the continuous F power amplifier working mode, the design space of a single continuous harmonic control power amplifier has been widened, and the efficiency and the relative bandwidth are effectively improved.

In certain embodiments, the input matching network 11 can be configured as a fourth-order low pass filter. Compared with a multisection impedance transformer, it effectively reduces the area of input matching network.

In certain embodiments, the transistor M may be Cree corporation's GaN transistor CGH40010F, with operating frequency of 0-6 GHz and typical output power of 10 W.

In certain embodiments, the output matching network 12 and a parasitic network of the transistor M form a third-order low pass filter, which lowers the design difficulty. Such a design approach can be flexible as applied in different operating frequencies and different characteristic impedances. The input end of the parasitic network of the transistor M is connected to the nature drain of the transistor M, and the output end of the parasitic network of the transistor M is connected to the input end of the output matching network 12.

Figure 4:
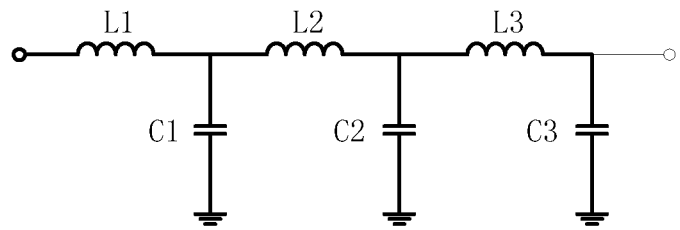
FIG. 4 illustrates a topological structure diagram of a third-order low pass filter formed by an output matching network and a parasitic network of a transistor in a harmonic power amplifying circuit with high efficiency and high bandwidth according to an embodiment of the present disclosure.

A topological structure diagram of a third-order low pass filter is illustrated in FIG. 4, which comprises:

an inductor L1, an inductor L2, an inductor L3, a capacitor C1, a capacitor C2, a capacitor C3;

wherein one end of the inductor L1 is the input end of the parasitic network, the other end of the inductor L1 is grounded through the capacitor C1, and the end of the inductor L1 is also connected to one end of the inductor L2; the other end of the inductor L2 is grounded through the capacitor C2, and the other end of the inductor L2 is also connected to one end of the inductor L3; the other end of the inductor L3 is the output end of the parasitic network and is grounded through the capacitor C3.

Figure 5:
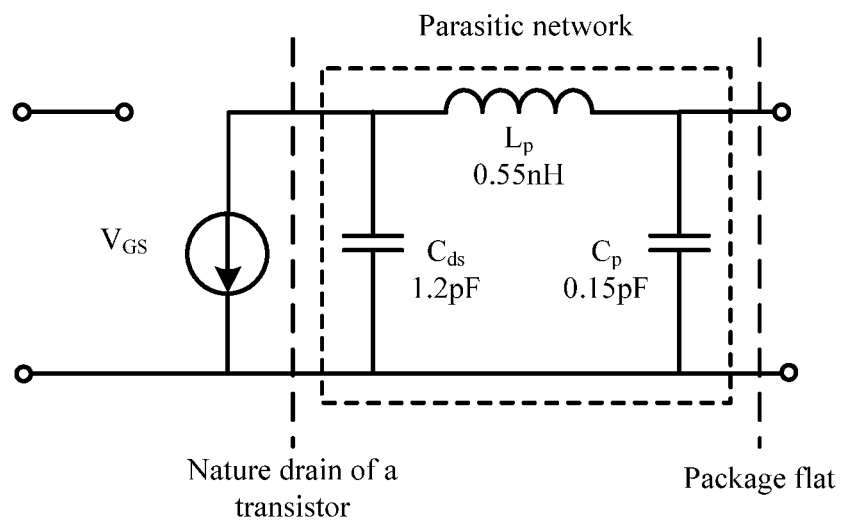
FIG. 5 illustrates a diagram of a parasitic network of a transistor in a harmonic power amplifying circuit with high efficiency and high bandwidth, according to an embodiment of the present disclosure.

The parasitic network of the transistor M is illustrated in FIG. 5, which comprises:

an inductor $L_p$; a capacitor $C_{ds}$ and a capacitor $C_p$;

wherein one end of the inductor $L_p$ is the input end of the parasitic network and is connected to one end of the capacitor $C_{ds}$, the other end of the inductor $L_p$ is the output end of the parasitic network and is connected to one end of the capacitor $C_p$, and the other end of capacitor $C_p$ is connected to the other end of the capacitor $C_{ds}$.

Figure 6:
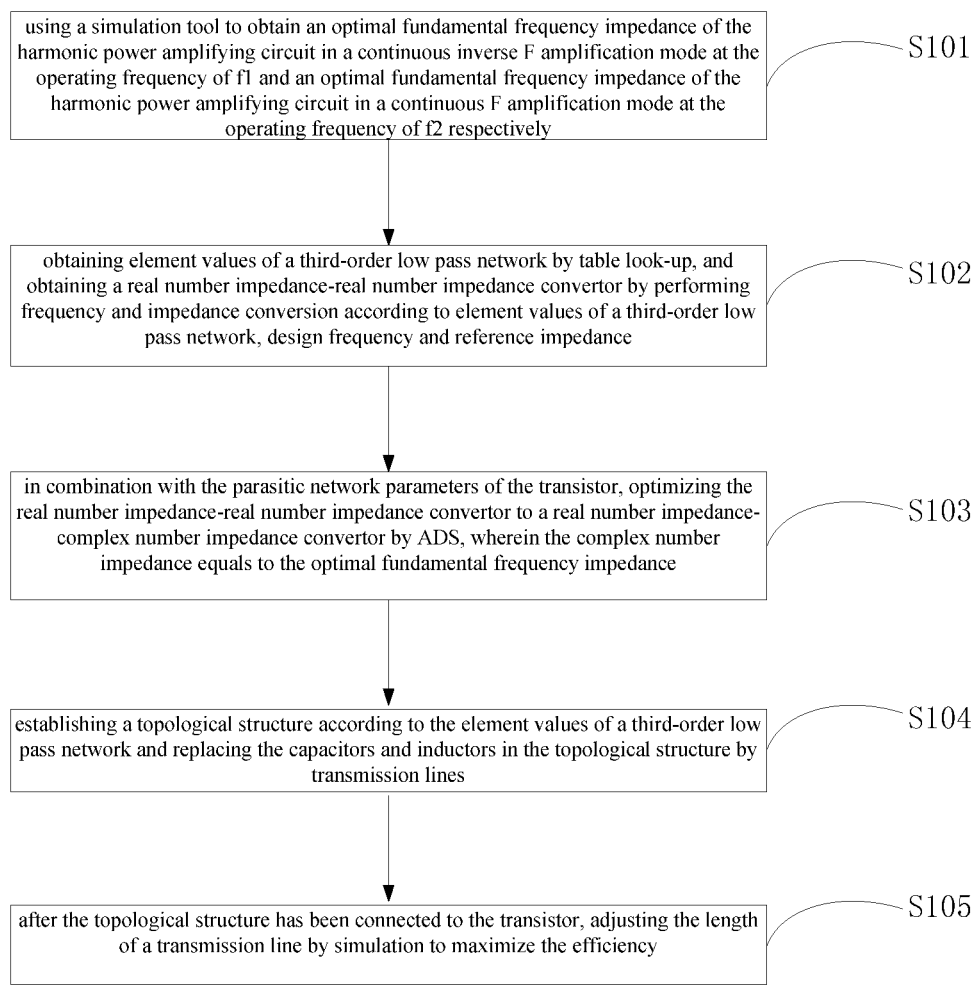
FIG. 6 illustrates a flow chart of a design method of an output matching network in a harmonic power amplifying circuit with high efficiency and high bandwidth according to an embodiment of the present disclosure.

A flow chart of a design method of an output matching network 12 is illustrated in FIG. 6, which specifically comprises the following steps.

In step S101, an ADS loadpull simulation tool, that is executed by a processor circuit, is used to obtain an optimal fundamental frequency impedance of the harmonic power amplifying circuit in a continuous inverse F amplification mode at the operating frequency of f1 and an optimal fundamental frequency impedance of the harmonic power amplifying circuit in a continuous F amplification mode at the operating frequency of f2, respectively.

In step S102, element values of a third-order low pass network are obtained by table look-up, and a real number impedance-real number impedance convertor is obtained by performing frequency and impedance conversion according to element values of a third-order low pass network, design frequency, and reference impedance.

In step S103, in combination with the parasitic network parameters of the transistor M, the real number impedance-real number impedance convertor is optimized to a real number impedance-complex number impedance convertor by the ADS, wherein the complex number impedance equals to the optimal fundamental frequency impedance.

In step S104, a topological structure is established according to the element values of a third-order low pass network, and the capacitors and inductors in the topological structure are replaced by transmission lines.

As one embodiment of this disclosure, the inductors can be replaced by high-impedance transmission lines, and the capacitors can be replaced by low-impedance open circuit shunt stub transmission lines.

In certain embodiments, a step can also be comprised after step S104, as follows.

In step S105, after the topological structure has been connected to the transistor M, the length of a transmission line is adjusted by HB simulation to maximize the efficiency.

As an embodiment of this disclosure, in combination with FIG. 1, the output matching network 12 has a star transmission line structure, which comprises:

a first transmission line TL1, a second transmission line TL2, a third transmission line TL3, a fourth transmission line TL4, a fifth transmission line TL5, a sixth transmission line TL6, a seventh transmission line TL7, an eighth transmission line TL8, a ninth transmission line TL9, and a tenth transmission line TL10.

One end of the first transmission line TL1 is the input end of the output matching network 12, and the other end of the first transmission line TL1 is connected to one end of the second transmission line TL2, one end of the third transmission line TL3, and one end of the fourth transmission line TL4 at the same time; the other end of the second transmission line TL2 is the bias end of the output matching network 12; the other end of the fourth transmission line TL4 is connected to one end of the fifth transmission line TL5, one end of the sixth transmission line TL6, and one end of the seventh transmission line TL7 at the same time; and the other end of the seventh transmission line TL7 is connected to one end of the eighth transmission line TL8, one end of the ninth transmission line TL9, and one end of the tenth transmission line TL10 at the same time; the other end of the tenth transmission line TL10 is the output end of the output matching network 12.

In the embodiments of this invention, setting the center frequency of a lower sideband as f1 and setting the center frequency of an upper sideband as f2, there is a relationship between f1 and f2: $f1=\frac{2}{3}f2$. Because the output matching network 12 is designed to enable a lower sideband to work in a continuous inverse F mode and an upper sideband to work in a continuous F mode, the harmonic power amplifying circuit works in a standard continuous inverse F mode at frequency f1 and works in a standard continuous F amplification mode at frequency f2.

The continuous F power amplifier is combined with the continuous inverse F power amplifier. By means of the transition from the continuous inverse F power amplifier working mode to the continuous F power amplifier working mode, the design space of a single continuous harmonic control power amplifier may be widened, the efficiency of a continuous harmonic control power amplifier may be effectively improved to be higher than 60%, a relative bandwidth may be improved to be higher than 80%, and the harmonic impedance may be simple to match and easy to realize.

Another objective of the embodiments of this disclosure is to provide a radio-frequency power amplifier adopting the aforementioned harmonic power amplifying circuit with high efficiency and high bandwidth.

The above merely expresses preferred embodiments of this disclosure, which should not be construed as a limit to this disclosure. It should be noted that any modification, alternative, or improvement made within the spirit and principle of this invention should belong to the scope of this disclosure.

What is claimed is:

1. A harmonic power amplifying circuit with high efficiency and high bandwidth, comprising:
   an input matching network wherein the input matching network has an input end and an output end; a transistor; and an output matching network;
   wherein the input end of the input matching network is an input end of the harmonic power amplifying circuit, a gate of the transistor is connected to the output end of the input matching network, a drain of the gate is connected to an input end of the output matching network, a source of the output matching network is grounded, and the output end of the output matching network is an output end of the harmonic power amplifying circuit,
   wherein the output matching network enables a lower sideband of the harmonic power amplifying circuit to work in a continuous inverse F amplification mode and an upper sideband of the harmonic power amplifying circuit to work in a continuous F amplification mode,
   wherein the output matching network and a parasitic network of the transistor form a low pass filter, and
   wherein a relationship between a center frequency of the lower sideband and a center frequency of the upper sideband of the harmonic power amplifying circuit is: $f1=\frac{2}{3}f2$, wherein f1 refers to the center frequency of the lower sideband, and f2 refers to the center frequency of the upper sideband.

2. The harmonic power amplifying circuit of claim 1, wherein the input matching network is a fourth-order low pass filter.

3. The harmonic power amplifying circuit of claim 1, wherein the transistor is a GaN transistor with an operating frequency of 0-6 GHz and an output power of 10 W.

4. The harmonic power amplifying circuit of claim 1, wherein the output matching network and the parasitic network of the transistor form a third-order low pass filter, an input end of the parasitic network of the transistor is connected to a nature drain of the transistor, and the output end of the parasitic network is connected to the input end of the output matching network;
   wherein a topological structure of the third-order low pass filter comprises:
   an first inductor, a second inductor, a third inductor, a first capacitor, a second capacitor, a third capacitor;
   wherein one end of the first inductor is the input end of the parasitic network, and an opposite end of the first inductor is grounded through the first capacitor and is also connected to one end of the second inductor; an opposite end of the second inductor is grounded through the second capacitor and is also connected to one end of the third inductor; and an opposite end of the third inductor is the output end of the parasitic network and is grounded through the third capacitor.

5. The harmonic power amplifying circuit of claim 1, wherein the output matching network has a star transmission line structure, the star transmission line structure comprising:
   a first transmission line, a second transmission line, a third transmission line, a fourth transmission line, a fifth transmission line, a sixth transmission line, a seventh transmission line, an eighth transmission line, a ninth transmission line, and a tenth transmission line;
   wherein one end of the first transmission line is the input end of the output matching network, and an opposite end of the first transmission line is connected to one end of the second transmission line, one end of the third transmission line, and one end of the fourth transmission line simultaneously; an opposite end of the second transmission line is a bias end of the output matching network; an opposite end of the fourth transmission line is connected to one end of the fifth transmission line, one end of the sixth transmission line, and one end of the seventh transmission line simultaneously; and an opposite end of the seventh transmission line is connected to one end of the eighth transmission line, one end of the ninth transmission line, and one end of the tenth transmission line simultaneously; an opposite end of the tenth transmission line is the output end of the output matching network.

6. A radio-frequency power amplifier, wherein the radio-frequency power amplifier comprises:
   a harmonic power amplifying circuit, the harmonic power amplifying circuit comprising:
   an input matching network, wherein the input matching network has an input end and an output end; a transistor; and an output matching network;
   wherein the input end of the input matching network is an input end of the harmonic power amplifying circuit, a gate of the transistor is connected to the output end of the input matching network, a drain of the gate is connected to an input end of the output matching network, a source of the output matching network is grounded, and the output end of the output matching network is an output end of the harmonic power amplifying circuit,
   wherein the output matching network enables a lower sideband of the harmonic power amplifying circuit to work in a continuous inverse F amplification mode and an upper sideband of the harmonic power amplifying circuit to work in a continuous F amplification mode, wherein the output matching network and a parasitic network of the transistor form a low pass filter, and wherein a relationship between a center frequency of the lower sideband and a center frequency of the upper sideband of the harmonic power amplifying circuit is: $f1=\frac{2}{3}f2$, wherein f1 refers to the center frequency of the lower sideband, and f2 refers to the center frequency of the upper sideband.

7. A processor implemented method of designing an output matching network of a harmonic power amplifying circuit, the method comprising:

generating, using a processor circuit executing a simulation tool, a first optimal fundamental frequency impedance of the harmonic power amplifying circuit in a continuous inverse F amplification mode at an operating frequency of f1;

generating a second optimal fundamental frequency impedance of the harmonic power amplifying circuit in a continuous F amplification mode at an operating frequency of f2;

determining element values of a third-order low pass network by comparison to a table;

performing frequency and impedance conversion according to element values of the third-order low pass network, a design frequency, and a reference impedance, to generate a real number impedance-real number impedance convertor;

optimizing, using parasitic network parameters of a transistor, the real number impedance-real number impedance convertor to generate a real number impedance-complex number impedance convertor, wherein a complex number impedance equals the first or second optimal fundamental frequency impedance; and determining a topological structure, based on the element values of the third-order low pass network; and generating the output matching network by modifying the topological structure by replacing a plurality of capacitors and a plurality of inductors in the topological structure by transmission lines.

8. The method of claim 7, further comprising replacing the plurality of inductors by high-impedance transmission lines, and replacing the plurality of capacitors by low-impedance open circuit shunt stub transmission lines.

9. The method of claim 7, wherein the method further comprises:

after the topological structure has been connected to the transistor, adjusting a length of a transmission line by simulation to maximize efficiency.

* * * * *